(12) United States Patent
Chang et al.

(10) Patent No.: US 6,576,974 B1
(45) Date of Patent: Jun. 10, 2003

(54) BIPOLAR JUNCTION TRANSISTORS FOR ON-CHIP ELECTROSTATIC DISCHARGE PROTECTION AND METHODS THEREOF

(75) Inventors: Chyh-Yih Chang, Hsinghuang (TW); Ming-Dou Ker, Hsinchu (TW); Hsin-Chin Jiang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/094,814

(22) Filed: Mar. 12, 2002

(51) Int. Cl.[7] ............................................... H01L 29/00
(52) U.S. Cl. ...................... 257/499; 257/526; 257/362
(58) Field of Search ............................. 257/335, 355, 257/356, 362, 363, 499, 517, 526, 552, 565

(56) References Cited

U.S. PATENT DOCUMENTS

| | | |
|---|---|---|
| 4,939,616 A | 7/1990 | Rountree |
| 5,012,317 A | 4/1991 | Rountre |
| 5,225,702 A | 7/1993 | Chatterjee |
| 5,453,384 A | 9/1995 | Chatterjee |
| 5,465,189 A | 11/1995 | Polgreen et al. |
| 5,502,328 A | 3/1996 | Chen et al. |
| 5,519,242 A | 5/1996 | Avery |
| 5,581,104 A | 12/1996 | Lowrey et al. |
| 5,629,544 A | 5/1997 | Voldman et al. |
| 5,631,793 A | 5/1997 | Ker et al. |
| 5,646,808 A | 7/1997 | Nakayama |
| 5,654,862 A | 8/1997 | Worley et al. |
| 5,719,737 A | 2/1998 | Maloney |
| 5,754,381 A | 5/1998 | Ker |
| 5,807,791 A | 9/1998 | Bertin et al. |
| 5,811,857 A | 9/1998 | Assaderaghi et al. |
| 5,907,462 A | 5/1999 | Chatterjee et al. |
| 5,910,874 A | 6/1999 | Iniewski et al. |
| 5,932,918 A | 8/1999 | Krakauer |
| 5,940,258 A | 8/1999 | Duvvury |
| 5,990,520 A | 11/1999 | Noorlag et al. |
| 6,015,992 A | 1/2000 | Chatterjee et al. |
| 6,034,397 A | 3/2000 | Voldman |
| 6,081,002 A | 6/2000 | Amerasekera et al. |
| 6,258,634 B1 | 7/2001 | Wang et al. |
| 2002/0033520 A1 * | 3/2002 | Kunikiyo .................... 257/577 |

OTHER PUBLICATIONS

M–D. Ker, et al., "CMOS On–Chip ESD Protection Design with Substrate–triggering Technique," Proc. of ICECS, vol. 1, pp. 273–276, 1998.

C. Duvvury et al., "Dynamic Gate Coupling for NMOS for Efficient Output ESD Protection", Proc. of IRPS, pp. 141–150, 1992.

N. K. Verghese and D. Allstot, "Verification of RF and Mixed–Signed Integrated Circiuts for Substrate Coupling Effects", in *Proc. of IEEE Custom Integrated Circuits Conf.*, 1997, pp. 363–370.

(List continued on next page.)

*Primary Examiner*—Tuan H. Nguyen
(74) *Attorney, Agent, or Firm*—Finnegan, Henderson, Farabow, Garrett & Dunner, L.L.P.

(57) ABSTRACT

An integrated circuit device receiving signals from a signal pad that includes at least one silicon bipolar junction transistor responsive to the signals from the signal pad for providing electrostatic discharge protection, and a detection circuit for detecting the signals from the signal pad and providing a bias voltage to the at least one silicon bipolar junction transistor, wherein the at least one silicon bipolar junction transistor includes an emitter, collector and base formed in a single silicon layer and isolated from a substrate of the integrated circuit device, and wherein the base is coupled to the detection circuit to receive the bias voltage.

34 Claims, 15 Drawing Sheets

OTHER PUBLICATIONS

M.Xu, D. Su, D. Shaeffer, T.Lee, and B. Wooley, Measuring and Modeling the Effects of Substrate Noise on LNA for a CMOS GPS Receiver, *IEEE Journal of Solid–State Circuits*, vol. 36, pp. 473–485, 2001.

R. Gharpurey, "A Methodology for Measurement and Characterization of Substrate Noise in High Frequency Circuits," in *Proc. of IEEE Custom Integrated Circuits Conf.*, 1999, pp. 487–490.

M. Nagata, J. Nagai, K. Hijikata, T. Morie, and A. Iwata, PhysicalDesign Guides for Substate Noise Reduction in CMOS Digital Circuits, *IEEE Journal of Solid–State Circuits*, vol. 36, pp. 539–549, 2001.

M.–D. Ker, T–Y, Chen, C–Y. Wu, and H.–H. Chang, ESD Protection Design on Analog Pin WIth Very Low Input Capacitance for High–Frequency or Current–Mode Applications, *IEEE Journal of Solid–State Circuits*, vol. 35, pp. 1194–1199, 2000.

M.–D. Ker, Whole–Chip ESD Protection Design with Efficient VDD–to–VSS ESD Clamp Circuit for Submicron CMOS VLSI, *IEEE Trans. on Electron Devices*, vol. 46, pp. 173–183, 1999.

C. Richier, P. Salome, G. Mabboux, I. Zaza, A. Juge, and P. Mortini, Investigation on Different ESD Protection Strategies Devoted to 3.3V RF Applications (2 (GHz) in a 0.18$\mu$m CMOS Process, in Proc. of EOS/ESD Symp., 200, pp. 251–259.

T.–Y. Chen and M.–D. Ker, "Design on ESD Protection Circuit With Low and Constant Input Capacitance," *in Proc. of IEEE Int. Symp. on Quality Electronic Design*, 2001, pp. 247–247.

M.–D. Ker, T.–Y. Chen, C.–Y. Wu, and H.–H. Chang, ESD Protection Design on Analog Pin WIth Very Low Input Capacitance for RF or Current–Mode Applications, *IEEE Journal of Solid–State Circuits*, vol. 35, pp. 1194–1199, 2000.

S. Voldman, et al. , "Semiconductor Process and Structural Optimization of Shallow Trench Isolation–Defined and Polysilicon–Bound Source/Drain Diodes for ESD Networks," in Proc. of EOS/ESD Symp., 1998, pp. 151–160.

S. Voldman et al., "Analysis of Snubber–Clamped Diode–String Mixed Voltage Interface ESD Protection Network for Advanced Microprocessors," in Proc. of EOS/ESD symposium, 1995, pp. 43–61.

M.J. Pelgrom, et al., "A 3/5 V Compatible I/O Buffer," IEEE Journal of Solid–State Circuits, vol. 30, No. 7, pp. 823–825, Jul. 1995.

G.P. Singh, et al., "High–Voltage–Tolerant I/OBuffers with Low–Voltage CMOS Process," IEEE Journal of Solid–State Circuits, vol. 34, No. 11, pp. 1512–1525, Nov. 1999.

H. Sanchez, et al., A Versatile 3.3/2.5/1.8–V CMOS I/O Driver Built in Built in 02. –82 m, 3.5–nm Tox, 1.8 –V CMOS Technology, IEEE Journal of Solid–State Circuits, vol. 34 No. 11.pp. 1501–1511, Nov. 1999.

\* cited by examiner

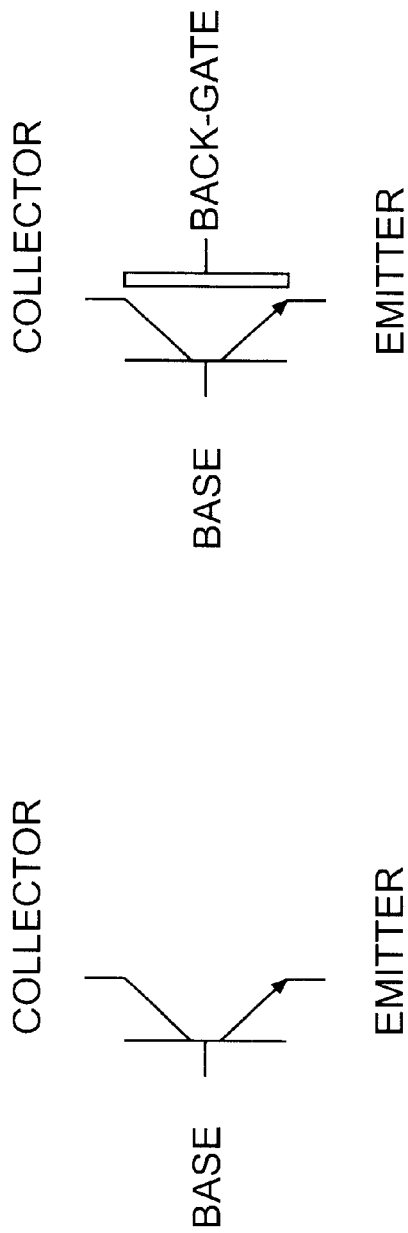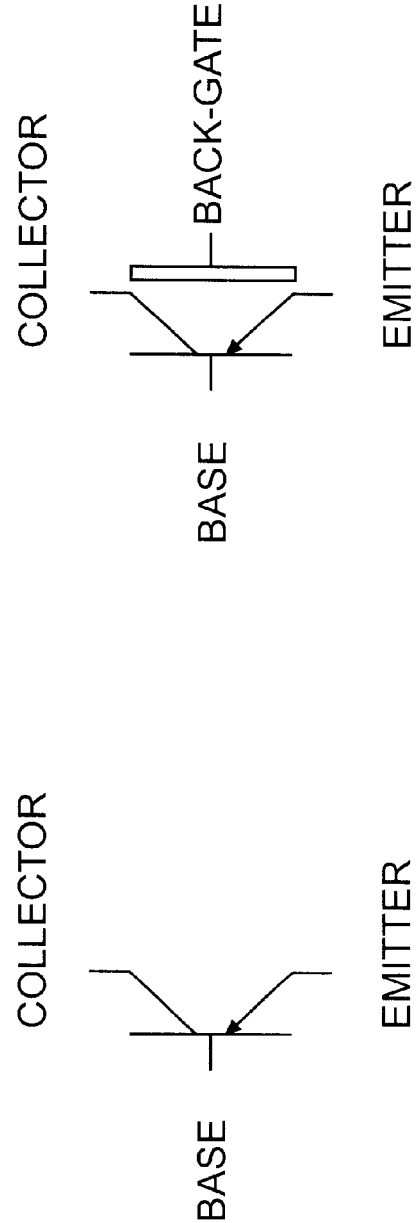
FIG. 12C
FIG. 12D
FIG. 12A
FIG. 12B

BIPOLAR JUNCTION TRANSISTORS FOR ON-CHIP ELECTROSTATIC DISCHARGE PROTECTION AND METHODS THEREOF

DESCRIPTION OF THE INVENTION

1. Field of the Invention

This invention pertains in general to a semiconductor device and, more particularly, to a silicon bipolar junction transistor for electrostatic discharge protection and methods thereof.

2. Background of the Invention

A semiconductor integrated circuit (IC) is generally susceptible an electrostatic discharge (ESD) event, which may damage or destroy the IC. An ESD event refers to a phenomenon of electrical discharge of a current (positive or negative) for a short duration in which a large amount of current is provided to the IC. The high current may be built-up from a variety of sources, such as the human body. Many schemes have been implemented to protect an IC from an ESD event, such as diodes or diode-coupled transistors in radio-frequency (RF) applications.

In RF applications, an on-chip ESD circuit should provide robust ESD protection, while exhibiting minimum parasitic input capacitance and low voltage-dependency. In a deep-submicron complementary metal-oxide semiconductor (CMOS) process with shallow-trench isolations (STIs), a diode has been used for ESD protection. The diode is formed contiguous with either an N+ or P+ diffusion region in a semiconductor substrate. FIG. 1A shows a cross-sectional view of a known diode ESD protection structure formed in an IC. Referring to FIG. 1A, a P+ diffusion region is bound by STIs on either side, and therefore the diode is also known as an STI-bound diode. However, an STI-bound diode has been found to have significant leakage current due to an interference between a silicide layer (not shown) of the P+ diffusion region and the STIs around the P+ region.

FIG. 1B shows a cross-sectional view of a known polysilicon-bound diode introduced to address the leakage current problem associated with an STI-bound diode. The P+ diffusion region in the polysilicon-bound diode is defined by a polysilicon gate, and therefore the leakage current from the edges of STIs is eliminated. However, the total parasitic capacitance of the polysilicon-bound diode is larger than that of the STI-bound diode because of the additional sidewall junction capacitance.

FIG. 2 is a circuit diagram showing a known ESD protection scheme using a dual-diode structure. Referring to FIG. 2, the combination of the dual-diode structure and $V_{DD}$-to-$V_{SS}$ ESD clamp circuit provides a path for an ESD current 2 to discharge to ground, preventing the ESD current 2 from passing through internal circuits. When the ESD current 2 is provided to a signal pad PAD1, and with a signal pad PAD2 coupled to relative ground, the ESD current 2 is conducted to $V_{DD}$ through a diode Dp1. The ESD current 2 is discharged to $V_{SS}$ through the $V_{DD}$-to-$V_{SS}$ ESD clamp circuit and flows out of the IC from the diode Dn2 to the pad PAD2. Diode Dp1 has a capacitance of Cp1 and diode Dn1 has a capacitance of Cn1. The total input capacitance $C_{in}$ of the circuit shown in FIG. 2 primarily comes from the parasitic junction capacitance of the diodes, and is calculated as follows:

$$C_{in}=Cp1+Cn1$$

wherein Cp1 and Cn1 are parasitic junction capacitances of diodes Dp1 and Dn1, respectively.

In addition, a silicon-controlled rectifier (SCR) has also been implemented for on-chip ESD protection. A feature of an SCR is its voltage-holding ability, at approximately 1 volt, in a non-epitaxial bulk CMOS process. In addition, an SCR can sustain high current and hold the voltage across the SCR at a low level, and may be implemented to bypass high current discharges associated with an ESD event. However, a conventional SCR device has a switching voltage of more than 30 volts in sub-micron CMOS processes, and therefore is not suitable to protect gate oxides in a sub-micron CMOS technology.

FIG. 3 is a reproduction of FIG. 3 of U.S. Pat. No. 5,012,317 to Rountre, entitled "Electrostatic Discharge Protection Circuit." Rountre describes a lateral SCR structure made up of a P+ type region 48, an N-type well 46, a P-type layer 44, and an N+ region 52. According to Rountre, a positive current associated with an ESD event flows through the region 48 to avalanche a PN junction between the well 46 and layer 44. The current flows from the layer 44 to the region 52 across the PN junction and ultimately to ground to protect an IC from the ESD event. However, a disadvantage of this known SCR structure is its susceptibility to being accidentally triggered by substrate noise.

In addition, the p-n-p-n path of an SCR device, such as the device shown in FIG. 3, is blocked by the insulator layer and shallow trench isolations (STIs) in an IC formed with a silicon-on-insulator (SOI) CMOS technology. Accordingly, SCR devices have been proposed in an integrated circuit based on the SOI CMOS technology. FIG. 4 is a reproduction of FIG. 4 of U.S. Pat. No. 6,015,992 to Chatterjee, entitled "Bistable SCR-like switch for ESD protection of silicon-on-insulator integrated circuits." Chatterjee describes an "SCR-like switch" provided by a first transistor 42 and a second transistor 44, separated from each other by an insulation region 60. The bistable SCR-like device has two additional lines 62, 64 to electrically connect the separate transistors.

FIG. 5 is a reproduction of FIG. 8B of U.S. Pat. No. 5,754,381 (the '381 patent) to Ker, one of the inventors of the present invention. The '381 patent is entitled "Output ESD Protection with High-Current-Triggered Lateral SCR" and describes a modified PMOS-trigger lateral SCR (PTLSCR) structure and NMOS-trigger lateral SCR (NTLSCR) structure. The '381 patent describes an NTLSCR 44 modified by an addition of a parasitic junction diode Dp2. The '381 patent describes that the modified PTLSCR or NTLSCR structure prevents an SCR from being triggered by a substrate noise current, thereby preventing device latch-up.

SUMMARY OF THE INVENTION

In accordance with the invention, there is provided An integrated circuit device that includes a substrate, a dielectric layer disposed over the substrate, and a layer of silicon, formed over the dielectric layer, including a first portion, a second portion, and a third portion disposed between the first and second portions, wherein the first and second portions are doped with the same type of impurity, and the third portion is doped with a different type of impurity from the first and second portions, and wherein the first, second and third portions form a silicon bipolar junction transistor, the first and second portions being one of collector and emitter, and the third portion being a base of the silicon bipolar junction transistor, to provide electrostatic discharge protection to the integrated circuit device.

In one aspect, the integrated circuit device further includes an insulating layer disposed between the substrate and the dielectric layer, wherein the integrated circuit device is a silicon-on-insulator device.

In another aspect, the silicon layer includes a fourth portion disposed between the second and third portions of the silicon layer.

In yet another aspect, the silicon bipolar junction transistor includes a back-gate adapted to receive a bias voltage to control the silicon bipolar junction transistor in providing electrostatic discharge protection.

Also in accordance with the present invention, there is provided an integrated circuit device that includes a substrate having a first insulator spaced-apart from a second insulator, and a biasing region disposed between the first and second insulating regions, a dielectric layer disposed over the substrate, and a layer of silicon, formed over the dielectric layer, including a first portion, a second portion, and a third portion disposed between the first and second portions, wherein the first and second portions are doped with the same type of impurity, and the third portion is doped with a different type of impurity from the first and second portions, and wherein the first, second and third portions form a silicon bipolar junction transistor, the first and second portions being one of collector and emitter, and the third portion being a base of the silicon bipolar junction transistor, to provide electrostatic discharge protection to the integrated circuit device.

In one aspect, the third portion of the silicon layer is disposed above the biasing region of the substrate to receive a bias voltage coupled from the biasing region.

In another aspect, the substrate includes a biasing pad for receiving a biasing voltage to bias the biasing region, wherein the biasing pad is contiguous with one of the first and second insulators.

In yet another aspect, the third and fourth portions of the silicon layer are disposed above the biasing region of the substrate for receiving a bias voltage coupled from the biasing region.

Further in accordance with the present invention, there is provided an integrated circuit device receiving signals from a signal pad that includes at least one silicon bipolar junction transistor responsive to the signals from the signal pad for providing electrostatic discharge protection, and a detection circuit for detecting the signals from the signal pad and providing a bias voltage to the at least one silicon bipolar junction transistor, wherein the at least one silicon bipolar junction transistor includes an emitter, collector and base formed in a single silicon layer and isolated from a substrate of the integrated circuit device, and wherein the base is coupled to the detection circuit to receive the bias voltage.

In one aspect, the at least one silicon bipolar junction transistor further comprises a back-gate, wherein the back-gate is coupled to the detection circuit to receive the bias voltage.

In another aspect, the detection circuit comprises a resistor-capacitor circuit having a delay constant shorter than the duration of the signals from the signal pad.

Additionally in accordance with the present invention, there is provided a method for protecting a semiconductor device from electrostatic discharge that includes providing a substrate, providing a dielectric layer disposed over the substrate, providing a silicon bipolar junction transistor formed in a layer of silicon over the dielectric layer, biasing the silicon bipolar junction transistor to provide electrostatic discharge protection.

In one aspect, the method also includes providing a back-gate in the silicon bipolar junction transistor to receive a bias voltage to control the silicon bipolar junction transistor in providing electrostatic discharge protection.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIGS. 12A–12D show circuit symbols for silicon bipolar junction transistors;

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

In accordance with the present invention, there is provided a silicon bipolar junction transistor (SBJT) for on-chip ESD protection. The SBJT of the present invention is fully compatible with the CMOS, SOI CMOS, and SiGe CMOS semiconductor manufacturing processes. In addition, the SBJT may include a substrate-triggered feature in an IC manufactured with the CMOS or SiGe CMOS manufacturing process for an improved turn-on speed of the SBJT and reduced leakage current. The SBJT may also include a base-triggered feature in an IC manufactured with the SOI CMOS manufacturing process to alter the trigger voltage of the SBJT. In addition, because the SBJT is isolated from the IC substrate, accidental triggering of an on-chip ESD protection circuit by substrate noise is minimized, thereby ensuring the performance of the IC. The SBJT is also more heat tolerant than known body BJTs with the same area in an IC manufactured with the SOI CMOS manufacturing process because the polysilicon that forms the SBJT is thicker than the body. The SBJT therefore also provides more flexibility in ESD protection circuit design.

Figure 1A:
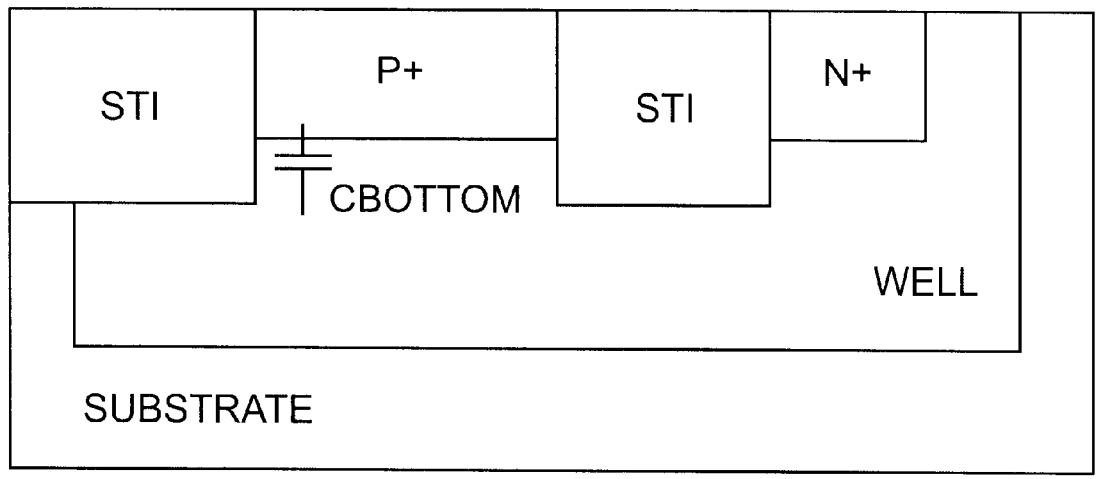
FIG. 1A shows a cross-sectional view of a known ESD protection device.
Figure 1B:
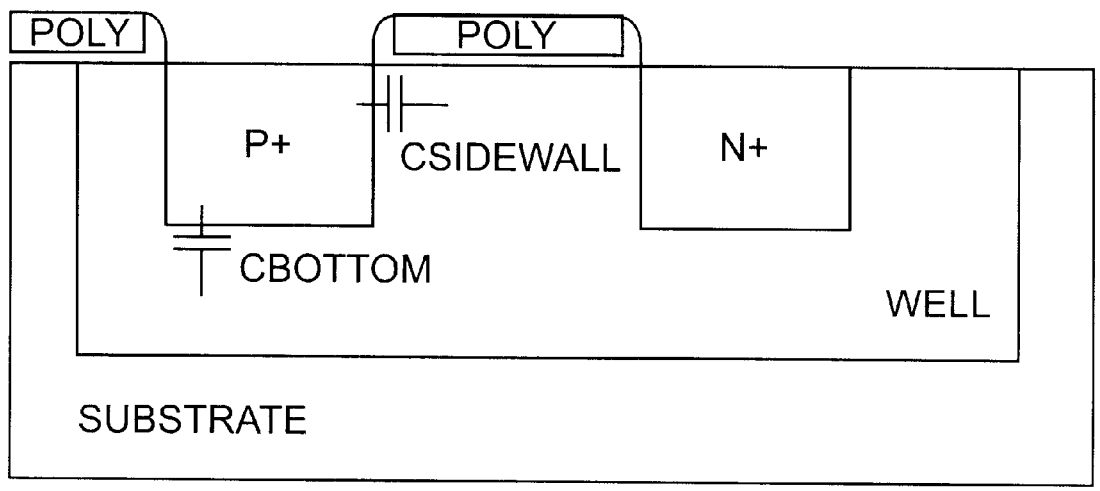
FIG. 1B shows a cross-sectional view of another known ESD protection device.
Figure 2:
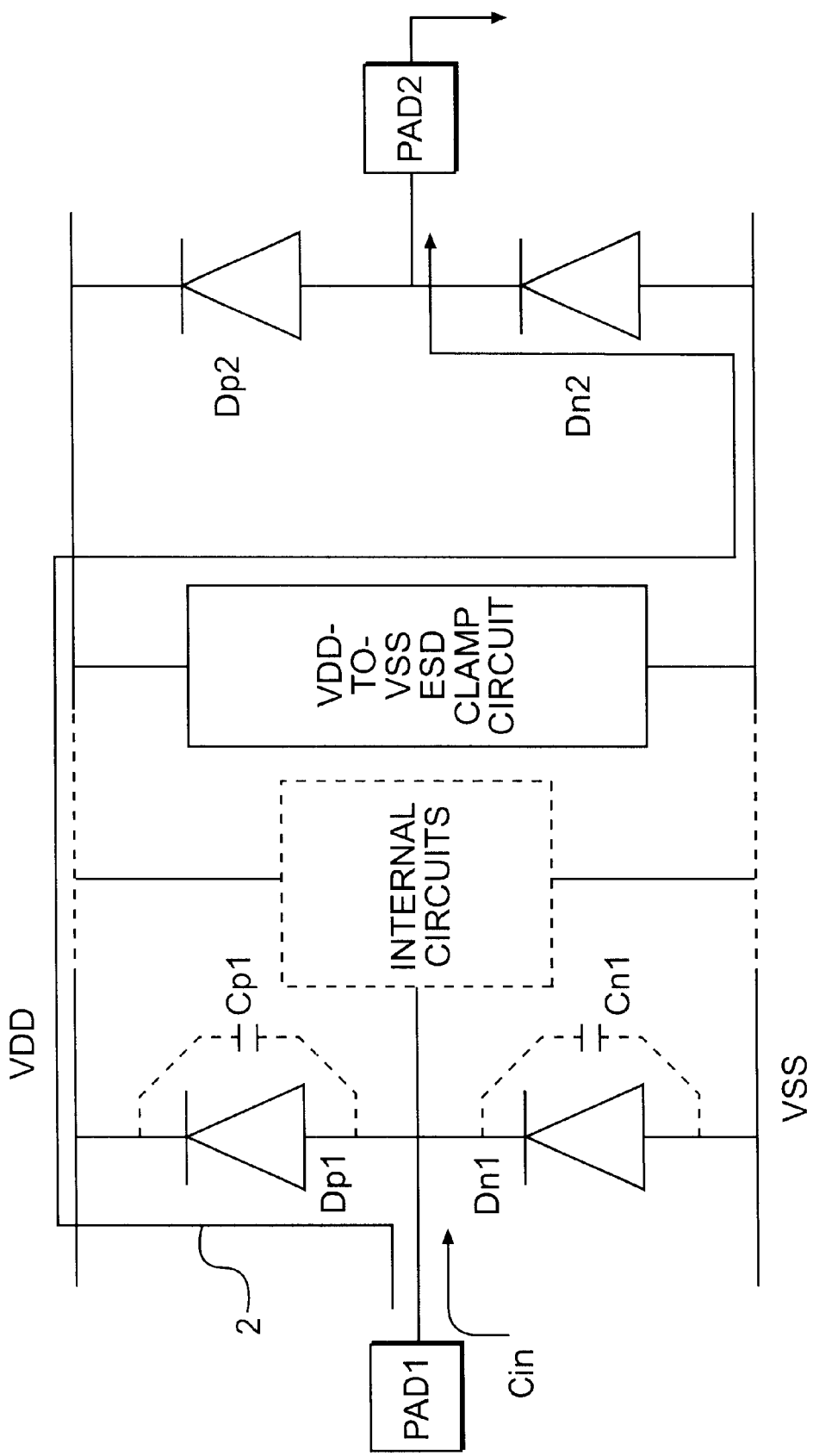
FIG. 2 is a circuit diagram of a known ESD protection device.
Figure 3:
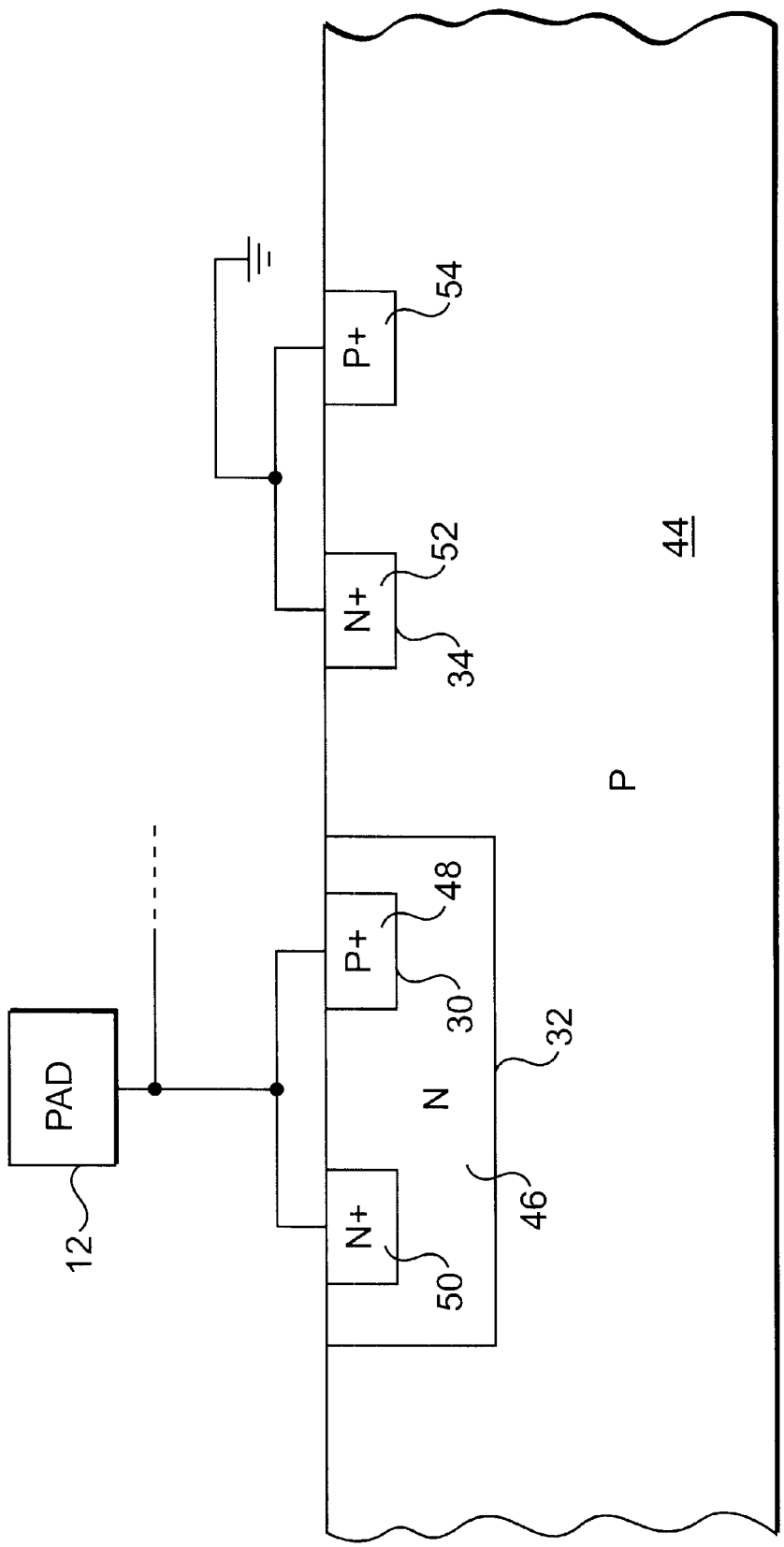
FIG. 3 is a cross-sectional view of a known silicon controlled rectifier.
Figure 4:
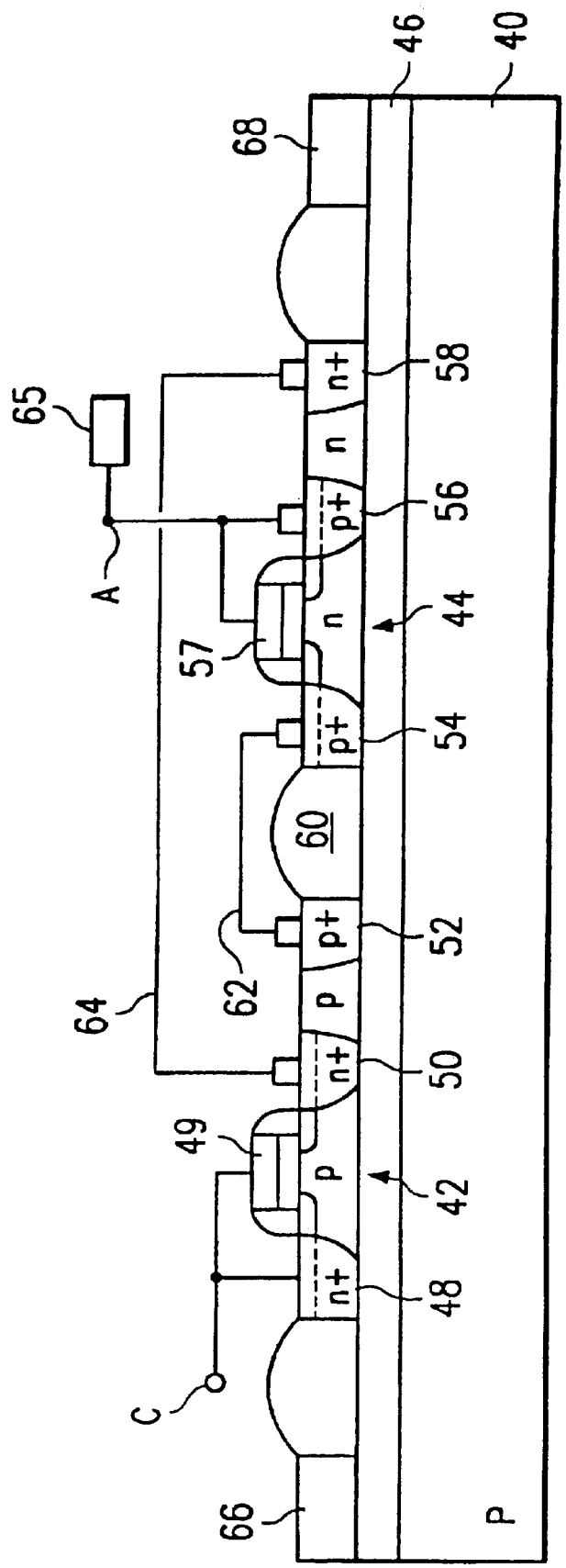
FIG. 4 shows a cross-sectional view of another known silicon controlled rectifier.
Figure 5:
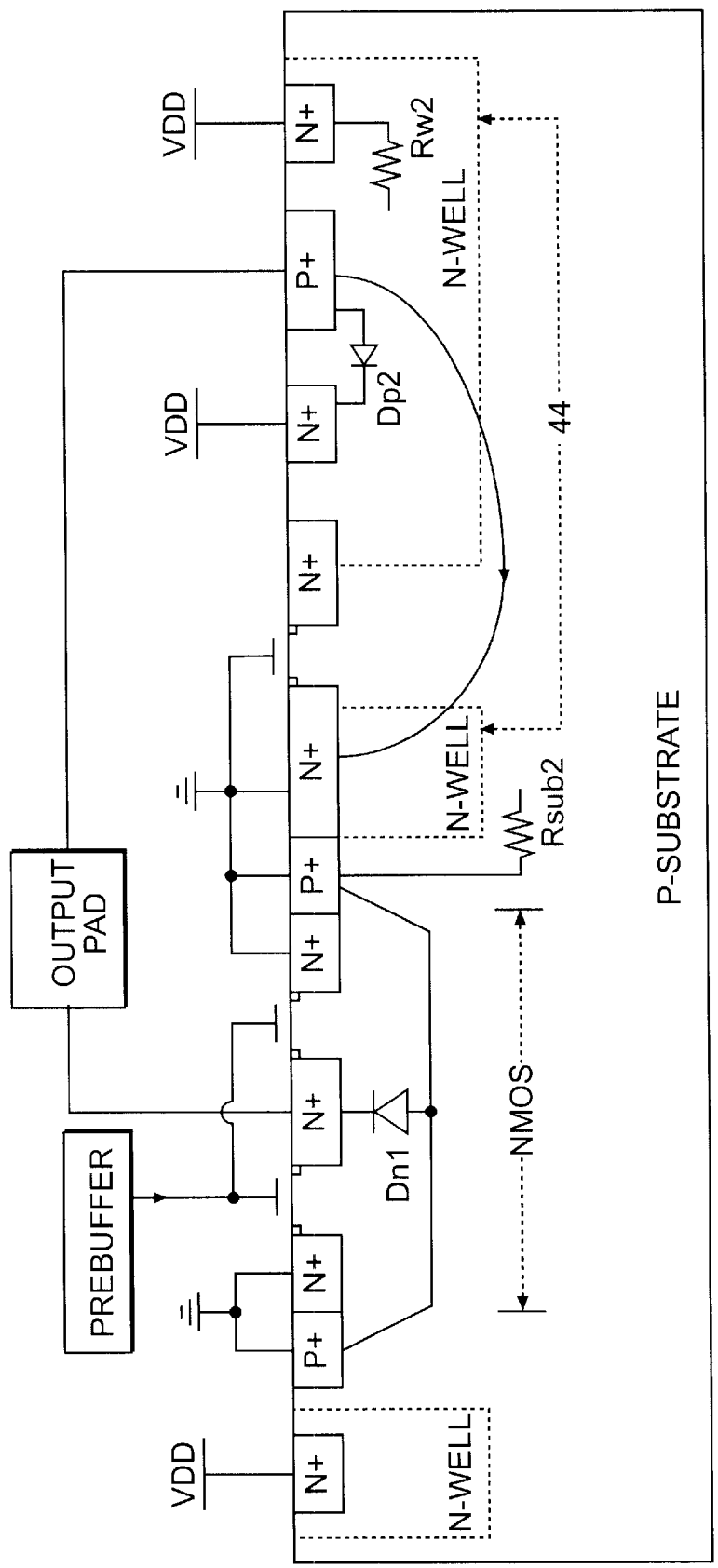
FIG. 5 shows a cross-sectional view of a known silicon controlled rectifier structure.
Figure 6:
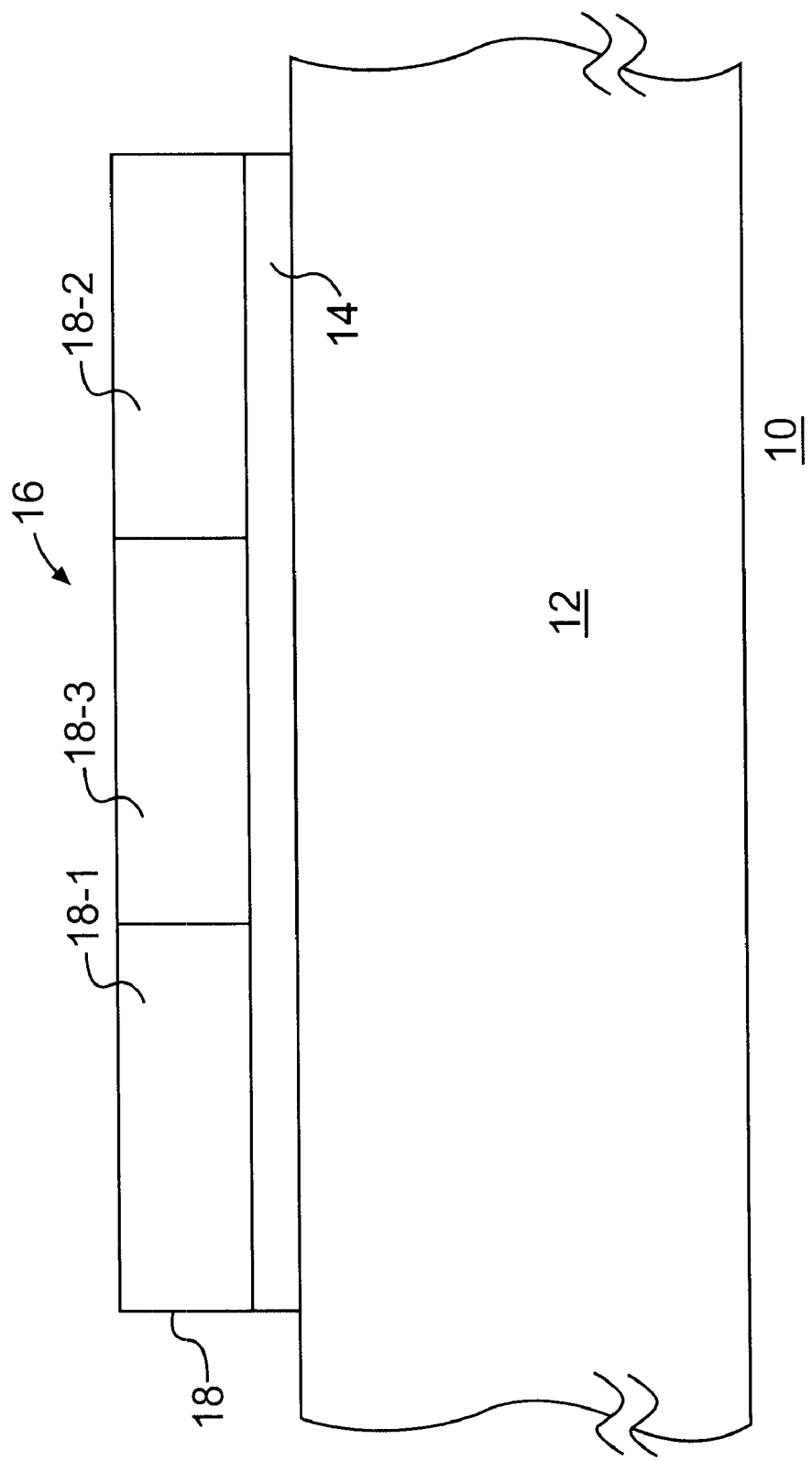
FIG. 6 is a cross-sectional view of a silicon bipolar junction transistor consistent with one embodiment of the present invention.

FIG. 6 is a cross-sectional view of a silicon bipolar junction transistor consistent with one embodiment of the present invention. Referring to FIG. 6, an integrated circuit 10 includes a substrate 12 and a dielectric layer 14 formed over the substrate 12. The substrate 12 may be any substrate, such as a silicon substrate, SOI base, or GaAs substrate, upon which semiconductor devices may be formed. The dielectric layer 14 may be comprised of silicon nitride ($Si_3N_4$), silicon dioxide ($SiO_2$), or any dielectric material sufficient to electrically isolate the substrate 12 from the SBJT of the present invention.

A layer of silicon 16 is disposed over the dielectric layer 14 to form a SBJT 18. In one embodiment, the silicon layer 16 is a layer of polysilicon. The SBJT 18 includes a first portion 18-1, a second portion 18-2, and a third portion 18-3 disposed between the first and second portions 18-1 and 18-2. The first and second portions 18-1 and 18-2 are doped with the same type of impurity. In one embodiment, the first and second portions 18-1 and 18-2 are n-type portions, and the third portion 18-3 is a p-type portion. In another embodiment, the first and second portions 18-1 and 18-2 are p-type portions, and the third portion 18-3 is an n-type portion. In either embodiment, the n-type regions may be formed during the formation of n-type MOS source/drain regions in the CMOS process. Similarly, the p-type regions may be formed during the formation of p-type MOS source/drain regions in the CMOS process. In another embodiment, the p-type regions are SiGe regions fabricated with an epitaxial process.

In operation, the SBJT 18 responds to ESD signals to provide electrostatic discharge protection. The first portion 18-1 functions as the collector and the second portion 18-2 functions as the emitter of the SBJT 18, or the first portion 18-1 functions as the emitter and the second portion 18-2 functions as the collector of the SBJT 18. The third portion 18-3 functions as the base of the SBJT 18.

Figure 7:
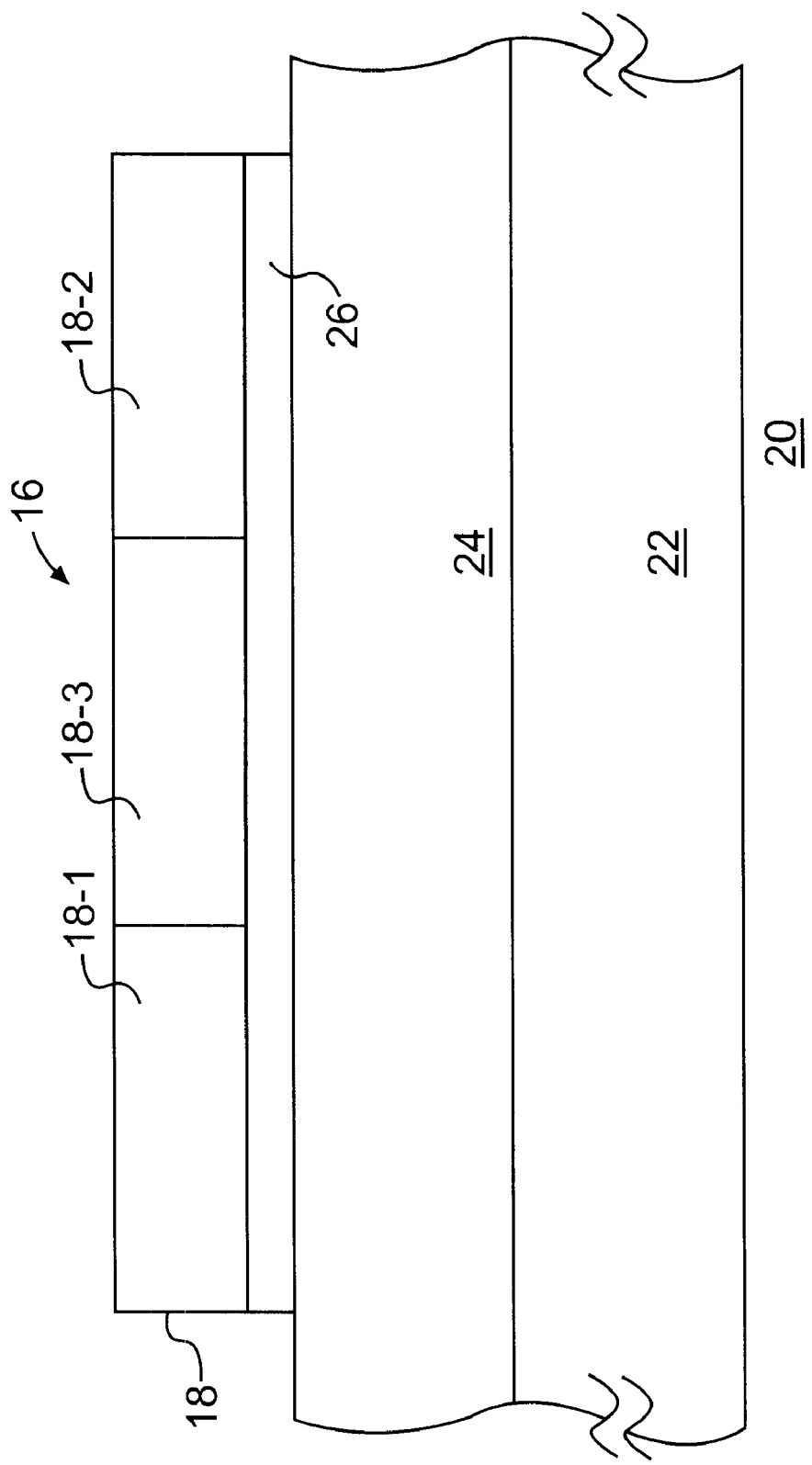
FIG. 7 is a cross-sectional view of a silicon bipolar junction transistor consistent with another embodiment of the present invention.

FIG. 7 is a cross-sectional view of a silicon bipolar junction transistor consistent with another embodiment of the present invention. Referring to FIG. 7, an integrated circuit 20 includes a substrate 22, an insulating layer 24 disposed over the substrate 22, and a dielectric layer 26 disposed over the insulating layer 24. The substrate 22 may be any substrate, such as a silicon substrate, SOI base, or GaAs substrate, upon which semiconductor devices may be formed. The insulating layer 24 may be a shallow trench isolation (STI). The dielectric layer 26 may be comprised of silicon nitride ($Si_3N_4$), silicon dioxide ($SiO_2$), or any dielectric material sufficient to electrically isolate the substrate 22 from the SBJT of the present invention. The insulating layer 24 is substantially thicker than the dielectric layer 26. A layer of silicon 16 is disposed over the dielectric layer 26 to form a SBJT 18. In one embodiment, the silicon layer 28 is a layer of polysilicon. The SBJT 18 includes a first portion 18-1, a second portion 18-2, and a third portion 18-3 disposed between the first and second n-type portions 18-1 and 18-2. The first and second portions 18-1 and 18-2 are doped with the same type of impurity. In one embodiment, the first and second portions 18-1 and 18-2 are n-type portions, and the third portion 18-3 is a p-type portion. In another embodiment, the first and second portions 18-1 and 18-2 are p-type portions, and the third portion 18-3 is an n-type portion.

In operation, the SBJT 18 responds to ESD signals to provide electrostatic discharge protection. The first portion 18-1 functions as the collector and the second portion 18-2 functions as the emitter of the SBJT 18, or the first portion 18-1 functions as the emitter and the second portion 18-2 functions as the collector of the SBJT 18. The third portion 18-3 functions as the base of the SBJT 18. In addition, the insulating layer 24 additionally isolates the SBJT 18 from the substrate 22 to minimize substrate noise coupling to the SBJT 18.

Figure 8:
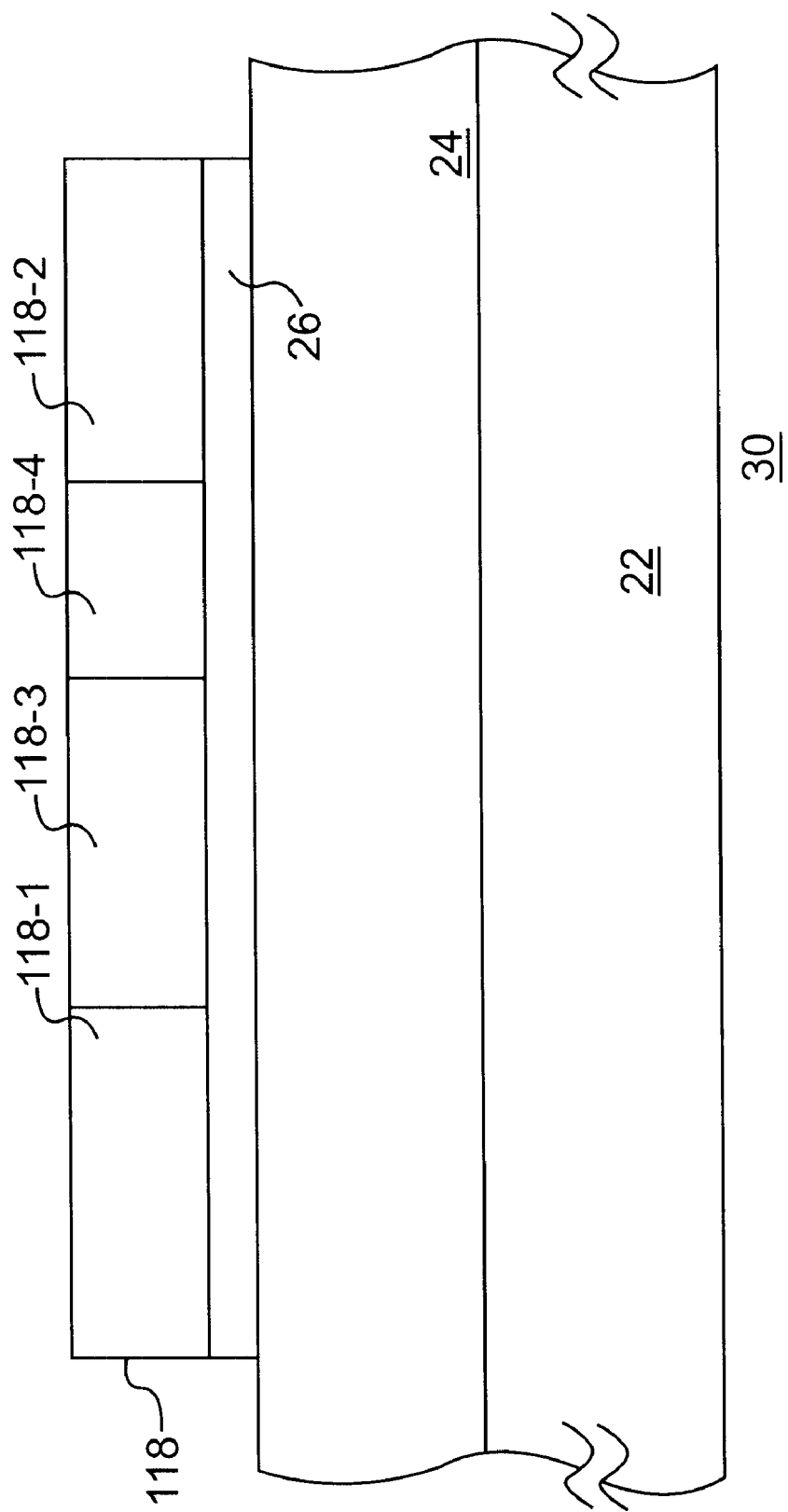
FIG. 8 is a cross-sectional view of a silicon bipolar junction transistor consistent with one embodiment of the present invention.

FIG. 8 is a cross-sectional view of a silicon bipolar junction transistor similar to the SBJT shown in FIG. 7. Referring to FIG. 8, the SBJT 118 additionally includes a fourth portion 118-4 disposed between the second and third portions 118-2 and 118-3. The fourth portion 118-4 may be an intrinsic, i.e., undoped, portion or a lightly doped p-type or n-type portion. In another embodiment, the fourth portion 118-4 is disposed between the first and second portions 118-1 and 118-3. In addition, the SBJT 118 of the present invention may be formed in the integrated circuit 10 shown in FIG. 6—without an insulating layer disposed between the substrate 12 and dielectric layer 14.

In operation, the fourth portion 118-4 of the SBJT 118 functions as a buffer between contiguous n-type and p-type regions, e.g., second portion 118-2 and third portion 118-3, to reduce leakage current of the SBJT 118. In addition, the fourth portion 118-4 increases the breakdown voltage of the SBJT 118.

Figure 9:
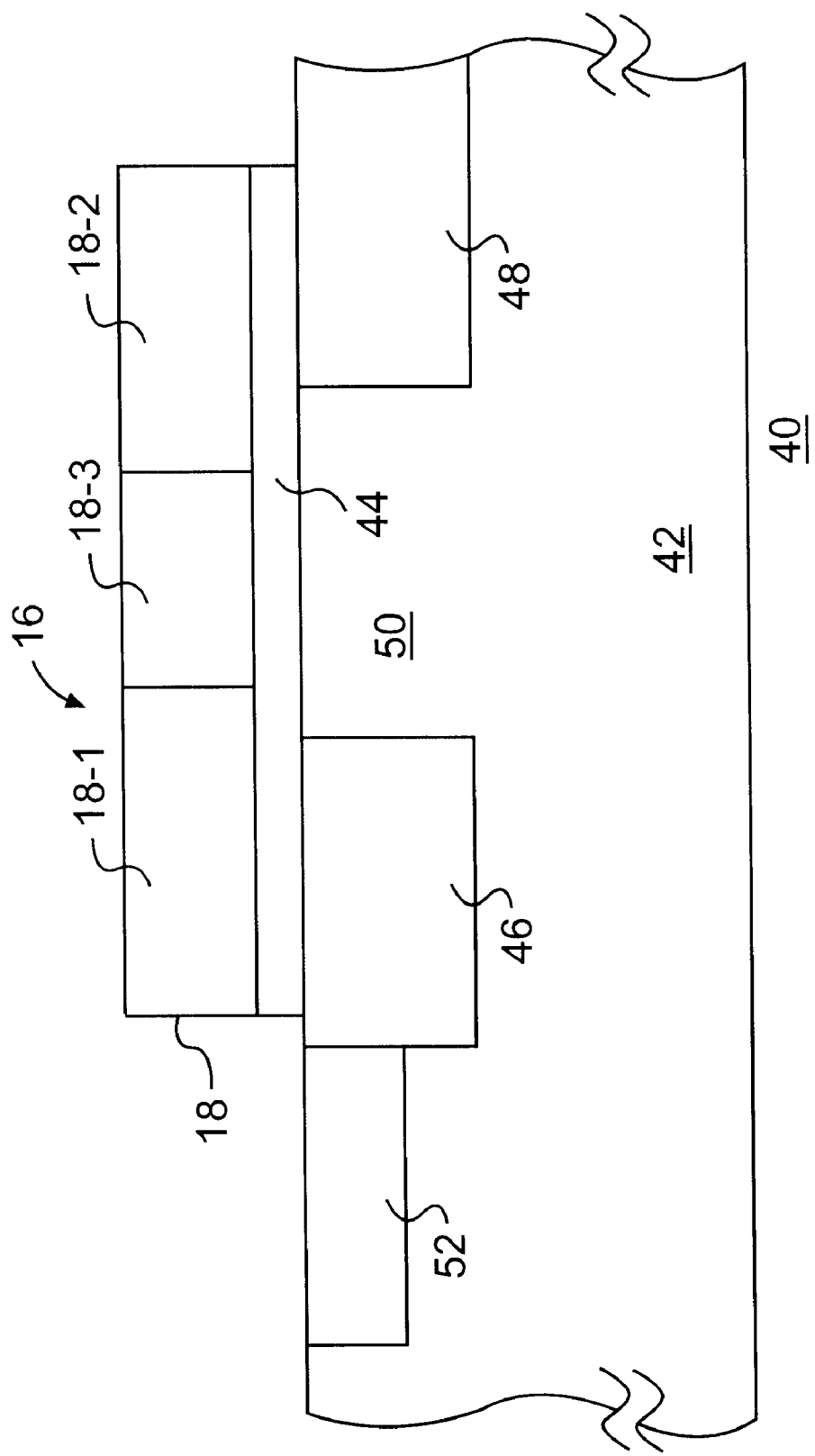
FIG. 9 is a cross-sectional view of a silicon bipolar junction transistor consistent with another embodiment of the present invention.

FIG. 9 shows a cross-sectional view of a SBJT in accordance with another embodiment of the present invention. Referring to FIG. 9, an integrated circuit 40 includes a substrate 42. The substrate 42 may be any substrate, such as a silicon substrate, SOI base, or GaAs substrate, upon which semiconductor devices may be formed. The substrate 42 includes a first insulator 46, a second insulator 48 spaced apart from the first insulator 46, and a biasing region 50 disposed between the first and second insulators 46 and 48. The substrate 42 further includes a biasing pad 52 formed contiguous with the first insulator 46.

The integrated circuit 40 also includes a dielectric layer 44 formed over the substrate 42. The dielectric layer 44 may be comprised of silicon nitride ($Si_3N_4$), silicon dioxide ($SiO_2$), or any dielectric material sufficient to electrically isolate the substrate 42 from the SBJT of the present invention. A layer of silicon 16 is disposed over the dielectric layer 44 to form a SBJT 18. In one embodiment, the silicon layer 16 is a layer of polysilicon. The SBJT 18 includes a first portion 18-1, a second portion 18-2, and a third portion 18-3 disposed between the first and second portions 18-1 and 18-2. Referring again to FIG. 9, the third portion 18-3 is disposed above the biasing region 50. The first and second portions 18-1 and 18-2 are doped with the same type of impurity. In one embodiment, the first and second portions 18-1 and 18-2 are n-type portions, and the third portion 18-3 is a p-type portion. In another embodiment, the first and second portions 18-1 and 18-2 are p-type portions, and the third portion 18-3 is an n-type portion.

In operation, the SBJT 18 responds to ESD signals to provide electrostatic discharge protection. The first portion 18-1 functions as the collector and the second portion 18-2 functions as the emitter of the SBJT 18, or the first portion 18-1 functions as the emitter and the second portion 18-2 functions as the collector of the SBJT 18. The third portion 18-3 functions as the base of the SBJT 18 and is disposed over the biasing region 50. In one embodiment in which the integrated circuit 40 is manufactured based on the CMOS or SiGe CMOS technology, the substrate 42 may be biased when a voltage is applied to the biasing pad 56 to bias the biasing region 50. The base 18-3 of the SBJT 18 is then biased to improve the turn-on speed and reduce leakage current of the SBJT 18. Therefore, by controlling the bias condition of the area under the SBJT 18, the leakage current and the turn-on voltage of the SBJT 18 can be controlled. The SBJT 18 thus maintains a low-level leakage current under normal operation conditions of the integrated circuit 40, and may be triggered quickly under an ESD event. In another embodiment in which the integrated circuit 40 is manufactured based on the SOI CMOS technology, the base 42 may be biased when a voltage is applied to the biasing pad 52 to bias the biasing region 50. The base 18-3 of the SBJT 18 is then biased to alter the turn-on voltage of the SBJT 18 and improve the robustness of the SBJT 18 for ESD protection.

Figure 10:
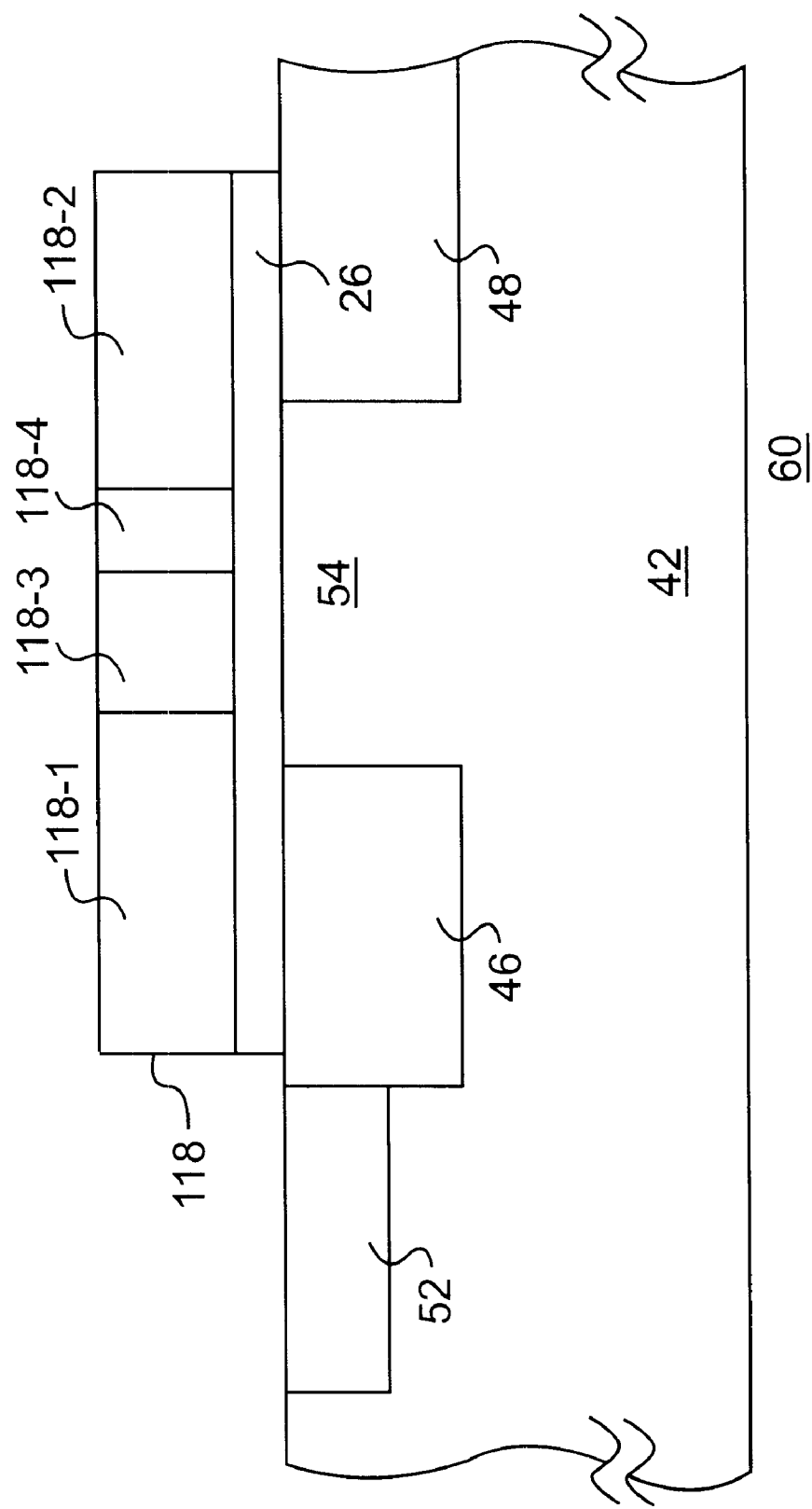
FIG. 10 is a cross-sectional view of a silicon bipolar junction transistor consistent with one embodiment of the present invention.

FIG. 10 shows a cross-sectional view of a SBJT in accordance with another embodiment of the present invention. The SBJT 118 shown in FIG. 10 is identical to that of FIG. 8. Referring to FIG. 10, both the third and fourth portions 118-3 and 118-4 of the SBJT 118 are disposed above the biasing region 54. Therefore, when the substrate 42 of the integrated circuit 60 is biased, both the third and fourth portions 118-3 and 118-4 are biased to improve the performance of the SBJT 118. In yet another embodiment, only the fourth portion 118-4 of the SBJT 118 is disposed over the biasing region 54 such that only the fourth portion 118-4 is biased when the substrate 42 of the integrated circuit 60 is biased.

Figure 11:
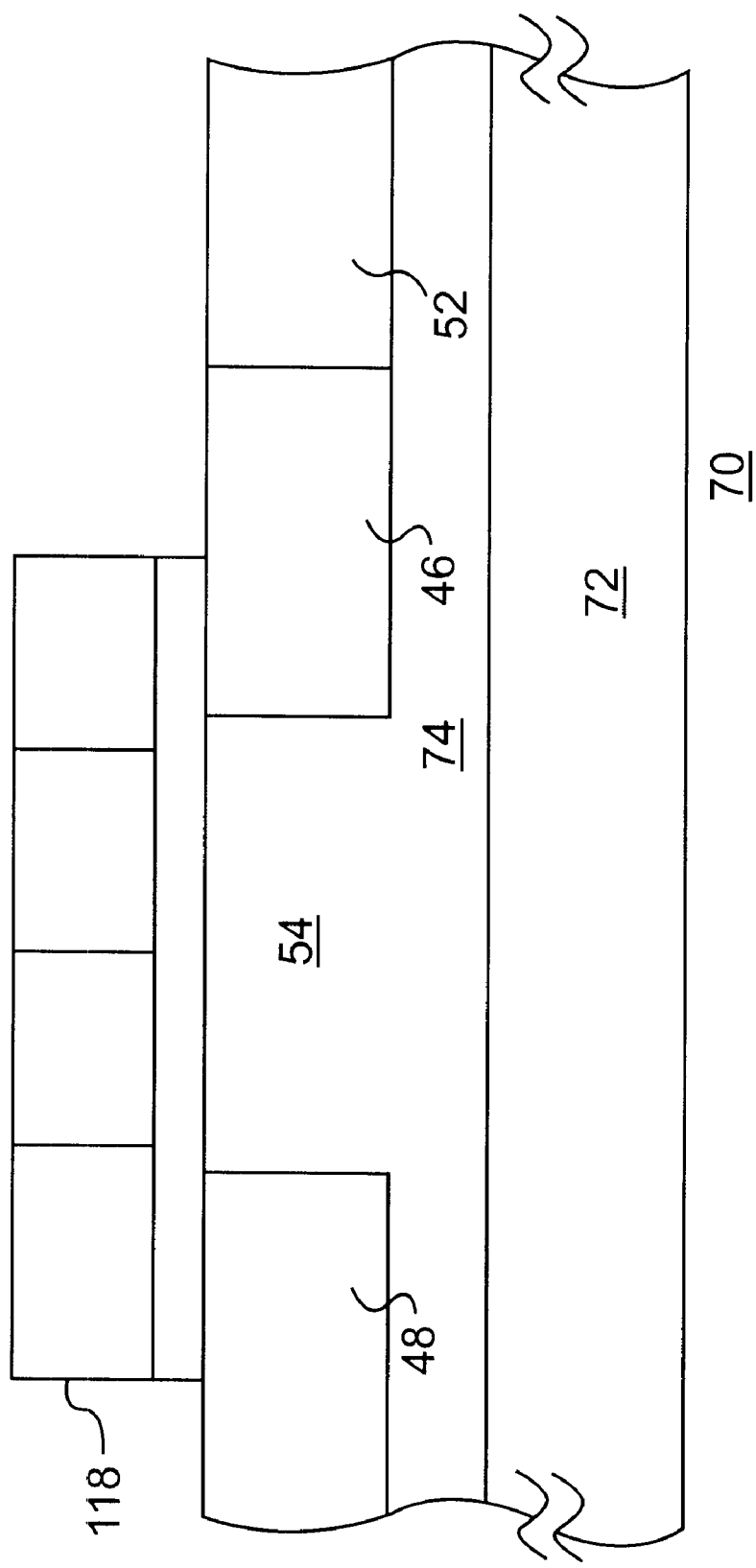
FIG. 11 is a cross-sectional view of a silicon bipolar junction transistor consistent with another embodiment of the present invention.

FIG. 11 is a cross-sectional view of a SBJT in accordance with another embodiment of the present invention. The integrated circuit 70 shown in FIG. 11 is identical to the integrated circuit 60 of FIG. 10, except the biasing region 54 is formed inside a well 74 in the substrate 72. In one embodiment, the substrate 72 is a p-type substrate, and the well 74 is an n-well. The biasing pad 52 is heavily doped with n-type impurities, or an n+ region. In another embodiment, the substrate 72 is an n-type substrate, and the well 74 is a p-well. The biasing pad 52 is heavily doped with p-type impurities, or a p+ region.

FIG. 12 shows the circuit symbols for the SBJTs. FIGS. 12A and 12B show two types of SBJTs without any biasing features, and FIGS. 12C and 12D show two types of SBJTs with biasing features. A SBJT without a biasing feature includes three terminals, collector, base, and emitter. A SBJT with a biasing feature additionally includes a fourth terminal, termed "back-gate."

Generally, each of the collector and emitter terminals of the SBJT of the present invention is coupled to a bond pad, with one bond pad relatively grounded from the other bond pad. During an ESD event, the ESD current is received at either of the bond pads, the SBJT can either enter a breakdown mode or bypass the ESD current between the two bond pads. In addition, the SBJT may be diode-coupled by connecting the base terminal to the emitter terminal. The base terminal may also be coupled to ground.

Therefore, the present invention also includes a method for protecting a semiconductor device from electrostatic discharge. The method provides a signal to the semiconductor device through a semiconductor circuit that includes at least one SBJT to protect the semiconductor device from electrostatic discharge. The substrate of the SBJT may be biased to improve the performance of the SBJT. Similarly, the present invention also includes a method for protecting a silicon-on-insulator (SOI) semiconductor device from electrostatic discharge. The method provides a signal to the device through a silicon-on-insulator circuit that includes at least one SBJT to protect the semiconductor device from electrostatic discharge. The base of the SBJT may also be biased to improve the performance of the SBJT in SOI devices.

Figure 13:
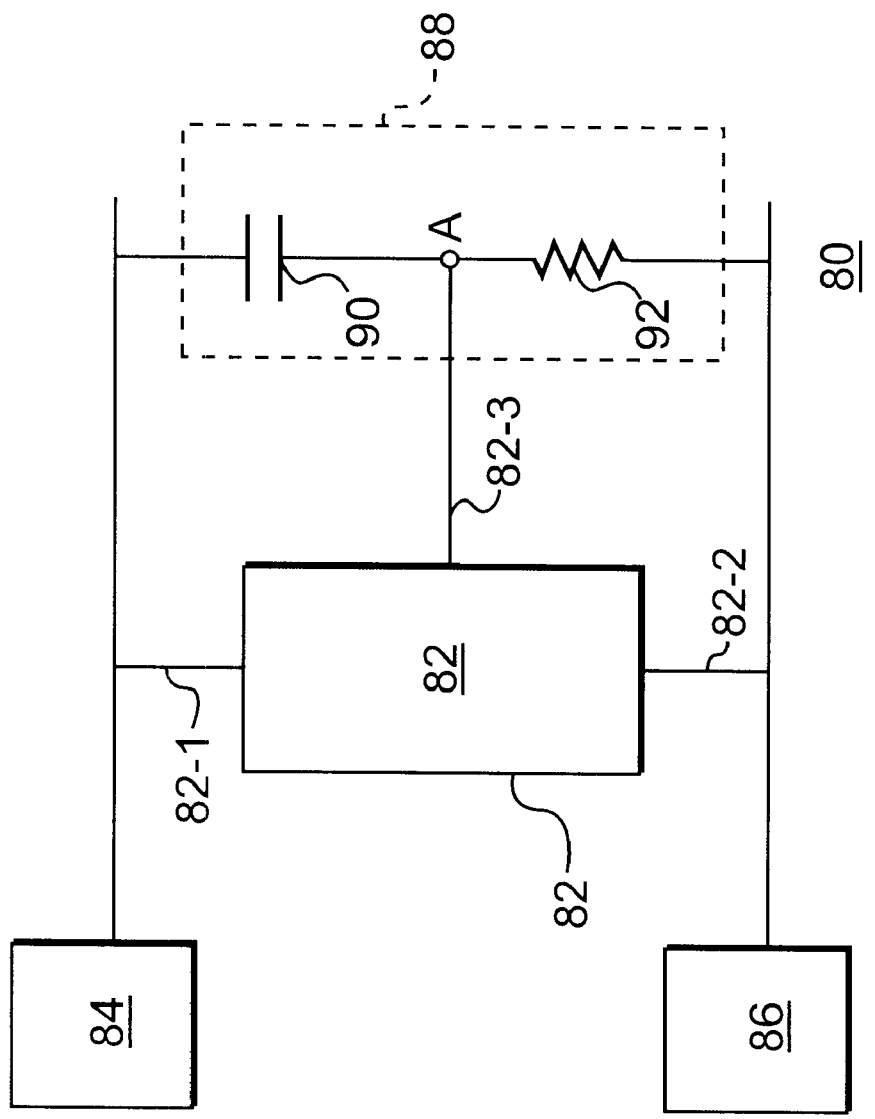
FIG. 13 is a circuit diagram of one embodiment of an ESD protection circuit consistent with the present invention.

FIG. 13 is a circuit diagram of one embodiment of an ESD protection circuit with a SBJT of the present invention. Referring to FIG. 13, an integrated circuit 80 includes a SBJT 82 of the present invention, a first bond pad 84, a second bond pad 86, and an ESD detection circuit 88. The integrated circuit 80 receives signals from either of pads 84 and 86. The SBJT 82 includes a collector 82-1 coupled to the bond pad 84, an emitter 82-2 coupled to the bond pad 86, and a base 82-3. In addition, the SBJT 82 may include a back-gate (not shown). The SBJT 82 is responsive to the signals from pads 84 and 86 to provide electrostatic discharge protection. The base 82-3 of the SBJT 82 is coupled to the ESD detection circuit 88. In one embodiment, both the base 82-3 and back-gate are coupled to the ESD detection circuit 88. In another embodiment, only the back-gate is coupled to the ESD detection circuit 88.

The detection circuit 88 includes a resistor-capacitor (R-C) circuit, a capacitor 90 and a resistor 92. The resistor-capacitor circuit is coupled in parallel with the SBJT 82.

Referring again to FIG. 13, the capacitor 90 is coupled to the bond pad 84 and the resistor 92 is coupled to the bond pad 86. The detection circuit 88 detects an ESD signal from the bond pad 84, and a portion of the signal voltage is coupled by the capacitor 90 to the node A between the capacitor 90 and resistor 92. The coupled voltage is then provided, as a bias voltage, to the SBJT 82 to reduce the trigger voltage of the SBJT 82, and therefore improve the turn-on speed of the SBJT 82. With the bond pad 86 coupled to ground, e.g., VSS, relative to the bond pad 84, the ESD signal flows from the bond pad 84 to the bond pad 86. In one embodiment, the capacitor 90 is coupled to the bond pad 86 and the resistor 92 is coupled to the bond pad 84. This embodiment provides ESD protection where the ESD signal is received at the bond pad 86.

Figure 14:
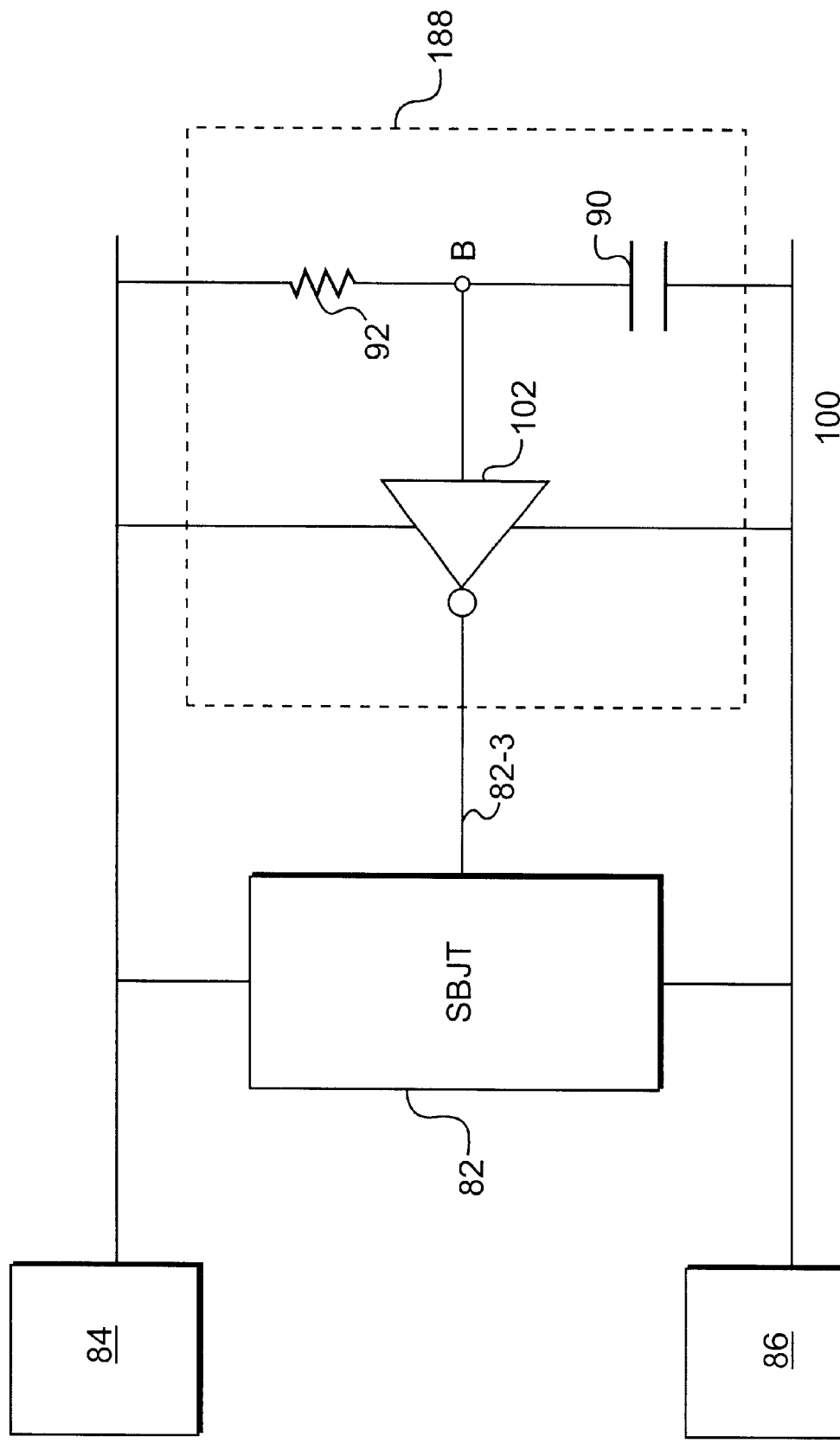
FIG. 14 is a circuit diagram of another embodiment of an ESD protection circuit consistent with the present invention.

FIG. 14 is a circuit diagram of another embodiment of an ESD protection circuit consistent with the present invention. Referring to FIG. 14, the integrated circuit 100 is essentially the same as the integrated circuit 80 shown in FIG. 13, with the exception that the ESD detection circuit 188 additionally includes an inverter 102. The ESD detection circuit 188 needs to distinguish an ESD signal from normal operation signals. Thus, the delay constant of the ESD detection circuit 188 should be longer than the duration of the electrostatic signals but shorter than the duration of normal operating signals. Preferably, the time constant of the ESD detection circuit 188 should be between approximately 0.1 uS to 2 nS, with 1.5 uS being the preference.

The base 82-3 of the SBJT 82 is coupled to the inverter 102. In one embodiment, both the base 82-3 and back-gate (not shown) of the SBJT 82 are coupled to the inverter 102. In another embodiment, only the back-gate is coupled to the inverter 102. With the delay constant as described above, the node B between the resistor 92 and capacitor 90 is at a low voltage in an ESD event, triggering the inverter 102 to provide a bias voltage to the SBJT 82 to provide ESD protection. In normal operations, the node B is at a high voltage, keeping the output signal of inverter 102 low.

Figure 15:
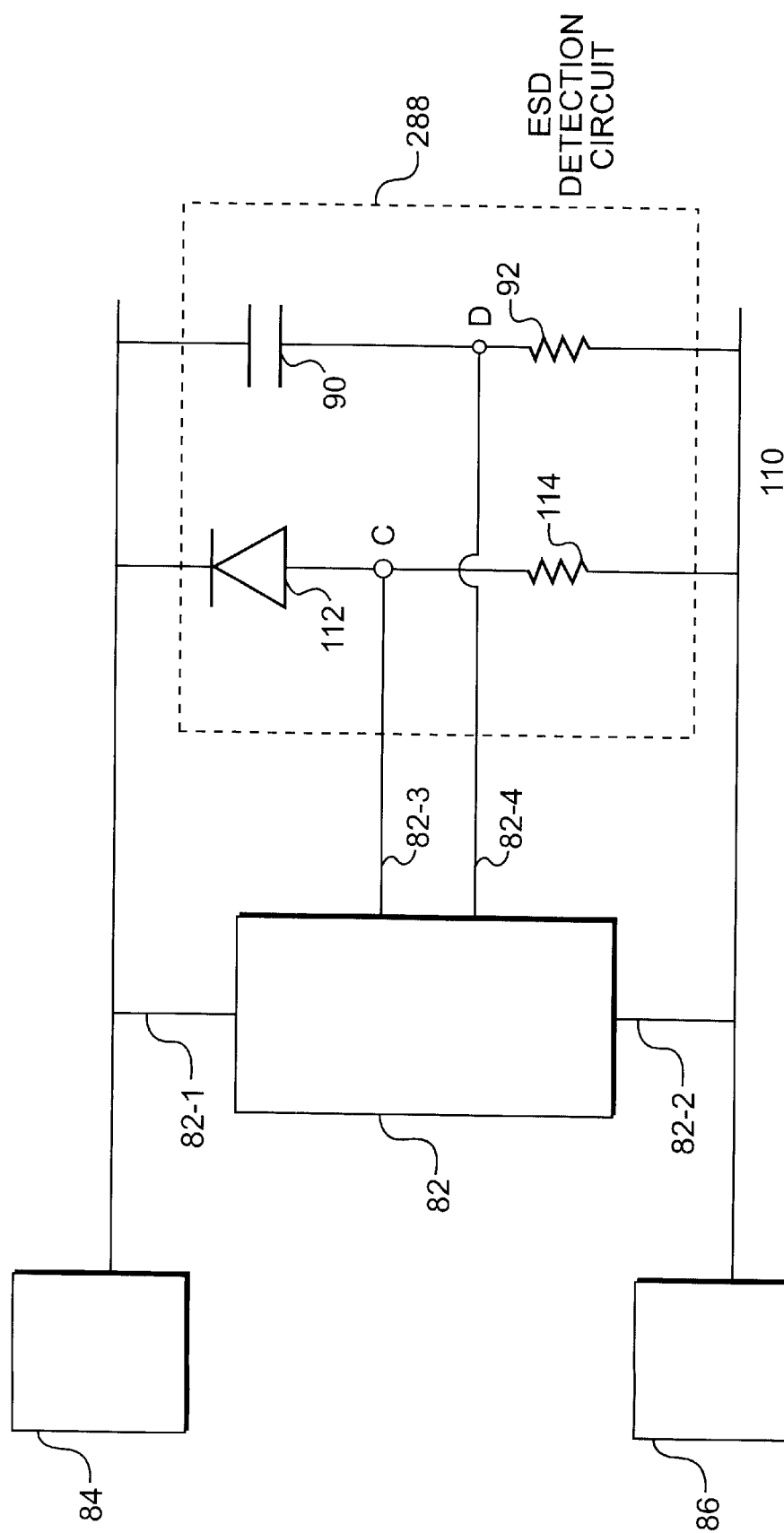
FIG. 15 is a circuit diagram of an embodiment of an ESD protection circuit consistent with the present invention.

FIG. 15 is a circuit diagram of another embodiment of an ESD protection circuit consistent with the present invention. Referring to FIG. 15, the integrated circuit 110 is essentially the same as the integrated circuit 80 of FIG. 13 with the exception that the ESD detection circuit 288 additionally includes a diode 112 and resistor 114 coupled in parallel to the R-C circuit. The bond pad 84 is coupled to the collector 82-1 of the SBJT 82, diode 112 and capacitor 90, and the bond pad 86 is coupled to the emitter 82-2 of the SBJT 82 and resistors 114 and 92. The base 82-3 of the SBJT 82 is coupled to the node C between the diode 112 and resistor 114, and the back-gate 82-4 of the SBJT 82 is coupled to the node D between the capacitor 90 and resistor 92. The bond pad 86 is coupled to ground, e.g., VSS, relative to the bond pad 84. In an ESD event, the bond pad 84 receives an ESD signal, the diode 112 operates in the breakdown mode and a portion of the breakdown current is provided to the resistor 114, thereby raising the potential at node C. This potential is provided to the base 82-3 of the SBJT 82 to trigger the SBJT 82. In one embodiment, the ESD detection circuit 288 operates without the resistor 114.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit device, comprising:
   a substrate;
   a dielectric layer disposed over the substrate; and
   a layer of silicon, formed over the dielectric layer, including a first portion, a second portion, and a third portion disposed between the first and second portions,
   wherein the first and second portions are doped with the same type of impurity and the third portion is doped with a different type of impurity from the first and second portions, and
   wherein the first, second and third portions form a silicon bipolar junction transistor, the first and second portions being one of collector and emitter, and the third portion being a base of the silicon bipolar junction transistor, and wherein the silicon bipolar junction transistor is turned on to discharge an electrostatic discharge (ESD) when the ESD appears on one of the collector, the emitter and the base, and another one of the collector, the emitter and the base is coupled to a relative ground.

2. The integrated circuit device as claimed in claim 1, wherein the first and second portions are n-type portions, and the third portion is a p-type portion.

3. The integrated circuit device as claimed in claim 1, wherein the first and second portions are p-type portions, and the third portion is an n-type portion.

4. The integrated circuit device as claimed in claim 1, further comprising an insulating layer disposed between the substrate and the dielectric layer, wherein the integrated circuit device is a silicon-on-insulator device.

5. The integrated circuit device as claimed in claim 1, wherein the silicon layer further comprises a fourth portion disposed between the second and third portions of the silicon layer.

6. The integrated circuit device as claimed in claim 5, wherein the fourth portion of the layer of silicon is doped with an impurity having a doped concentration lower than any of the first, second, or third portion of the silicon layer.

7. The integrated circuit device as claimed in claim 5, wherein the fourth portion of the layer of silicon is undoped.

8. The integrated circuit device as claimed in claim 5, further comprising an insulating layer disposed between the substrate and the dielectric layer.

9. The integrated circuit device as claimed in claim 8, wherein the fourth portion of the layer of silicon is doped an impurity having a doped concentration lower than any of the first, second, or third portion of the silicon layer.

10. The integrated circuit device as claimed in claim 8, wherein the fourth portion of the layer of silicon is undoped.

11. The integrated circuit device as claimed in claim 8, wherein the silicon bipolar junction transistor further comprises a back-gate adapted for receiving a bias voltage to control the silicon bipolar junction transistor in providing electrostatic discharge protection.

12. The integrated circuit device as claimed in claim 1, wherein the silicon bipolar junction transistor further comprises a back-gate adapted to receive a bias voltage to control the silicon bipolar junction transistor in providing electrostatic discharge protection.

13. An integrated circuit device, comprising:
    a substrate having a first insulator spaced-apart from a second insulator, and a biasing region disposed between the first and second insulating regions;
    a dielectric layer disposed over the substrate; and
    a layer of silicon, formed over the dielectric layer, including a first portion, a second portion, and a third portion disposed between the first and second portions,
    wherein the first and second portions are doped with the same type of impurity, and the third portion is doped with a different type of impurity from the first and second portions, and
    wherein the first, second and third portions form a silicon bipolar junction transistor, the first and second portions being one of collector and emitter, and the third portion being a base of the silicon bipolar junction transistor, to provide electrostatic discharge protection to the integrated circuit device.

14. The integrated circuit device as claimed in claim 13, wherein the third portion of the silicon layer is disposed above the biasing region of the substrate to receive a bias voltage coupled from the biasing region.

15. The integrated circuit device as claimed in claim 13, wherein the substrate further comprises a biasing pad for receiving a biasing voltage to bias the biasing region, wherein the biasing pad is contiguous with one of the first and second insulators.

16. The integrated circuit device as claimed in claim 13, wherein the silicon bipolar junction transistor further comprises a back-gate adapted for receiving a bias voltage to control the silicon bipolar junction transistor in providing electrostatic discharge protection.

17. The integrated circuit device as claimed in claim 13, wherein the silicon layer further comprises a fourth portion disposed between the second and third portions of the silicon layer.

18. The integrated circuit device as claimed in claim 17, wherein the third and fourth portions of the silicon layer are disposed above the biasing region of the substrate for receiving a bias voltage coupled from the biasing region.

19. The integrated circuit device as claimed in claim 17, wherein the fourth portion of the silicon layer is disposed above the biasing region of the substrate for receiving a bias voltage coupled from the biasing region.

20. The integrated circuit device as claimed in claim 17, wherein the fourth portion of the layer of silicon is doped with an impurity having a doped concentration lower than any of the first, second, or third portion of the silicon layer.

21. The integrated circuit device as claimed in claim 17, wherein the fourth portion of the layer of silicon is undoped.

22. The integrated circuit device as claimed in claim 13, further comprising an insulating layer disposed between the substrate and the dielectric layer, wherein the integrated circuit device is a silicon-on-insulator device.

23. The integrated circuit device as claimed in claim 22, wherein the silicon layer further comprises a fourth portion disposed between the second and third portions of the silicon layer.

24. The integrated circuit device as claimed in claim 22, wherein the fourth portion of the layer of silicon is doped with an impurity having a doped concentration lower than any of the first, second, or third portion of the silicon layer.

25. The integrated circuit device as claimed in claim 22, wherein the fourth portion of the layer of silicon is undoped.

26. The integrated circuit device as claimed in claim 22, wherein the silicon bipolar junction transistor further comprises a back-gate adapted for receiving a bias voltage to control the silicon bipolar junction transistor in providing electrostatic discharge protection.

27. An integrated circuit device receiving signals from a signal pad, comprising:
   at least one silicon bipolar junction transistor responsive to the signals from the signal pad for providing electrostatic discharge protection; and
   a detection circuit for detecting the signals from the signal pad and providing a bias voltage to the at least one silicon bipolar junction transistor,
   wherein the at least one silicon bipolar junction transistor includes an emitter, collector and base formed in a single silicon layer and isolated from a substrate of the integrated circuit device,
   and wherein the base is coupled to the detection circuit to receive the bias voltage.

28. The integrated circuit as claimed in claim 27, wherein the at least one silicon bipolar junction transistor further comprises a back-gate, wherein the back-gate is coupled to the detection circuit to receive the bias voltage.

29. The integrated circuit device as claimed in claim 27, further comprising a first silicon portion disposed between the base and one of the emitter and collector.

30. The integrated circuit device as claimed in claim 29, wherein the first silicon portion is doped with an impurity having a doped concentration lower than any of the emitter, base, or collector of the silicon layer.

31. The integrated circuit device as claimed in claim 29, wherein the first silicon portion is undoped.

32. The integrated circuit device as claimed in claim 27, wherein the detection circuit comprises a resistor-capacitor circuit having a delay constant shorter than the duration of the signals from the signal pad.

33. The integrated circuit device as claimed in claim 32, wherein the detection circuit further comprises a diode-resistor network coupled in parallel to the resistor-capacitor circuit.

34. The integrated circuit device as claimed in claim 32, wherein the detection circuit further comprises an inverter coupled to the base of the silicon bipolar junction transistor and in parallel to the resistor-capacitor circuit.

* * * * *